United States Patent
La Rosa

(12) 
(10) Patent No.: US 8,391,079 B2
(45) Date of Patent: Mar. 5, 2013

(54) EEPROM MEMORY ARCHITECTURE OPTIMIZED FOR EMBEDDED MEMORIES

(75) Inventor: Francesco La Rosa, Rousset (FR)

(73) Assignee: STMicroelectronics (Rousset) SAS, Rousset (FR)

(*) Notice: Subject to any disclaimer, the term of this patent is extended or adjusted under 35 U.S.C. 154(b) by 337 days.

(21) Appl. No.: 12/823,901

(22) Filed: Jun. 25, 2010

(65) Prior Publication Data

US 2010/0331045 A1    Dec. 30, 2010

(30) Foreign Application Priority Data

Jun. 26, 2009    (FR) .................................... 09 03130

(51) Int. Cl.
*G11C 11/34* (2006.01)
*G11C 16/04* (2006.01)

(52) U.S. Cl. .............................. 365/185.29; 365/185.12

(58) Field of Classification Search ............. 365/185.29, 365/185.12
See application file for complete search history.

(56) References Cited

U.S. PATENT DOCUMENTS

| | | | |
|---|---|---|---|
| 5,765,185 A | 6/1998 | Lambrache et al. | |
| 5,991,196 A | 11/1999 | Thomsen et al. | |
| 6,021,085 A * | 2/2000 | Goto | 365/230.03 |
| 2005/0018519 A1* | 1/2005 | Nii | 365/227 |
| 2005/0041476 A1 | 2/2005 | Sakui et al. | |
| 2005/0169057 A1* | 8/2005 | Shibata et al. | 365/185.28 |
| 2007/0076480 A1 | 4/2007 | Lee et al. | |

* cited by examiner

*Primary Examiner* — VanThu Nguyen
*Assistant Examiner* — Khamdan Alrobaie
(74) *Attorney, Agent, or Firm* — Seed IP Law Group PLLC

(57) ABSTRACT

The present disclosure relates to an electrically erasable and programmable memory comprising rows of memory cells to store words of N bits each, bit lines and word lines, wherein a row of memory cells comprises a first group of memory cells to store collectively erasable words, and at least one second group of memory cells to store one individually erasable word.

26 Claims, 4 Drawing Sheets

EEPROM MEMORY ARCHITECTURE OPTIMIZED FOR EMBEDDED MEMORIES

BACKGROUND

1. Technical Field

The present disclosure relates to nonvolatile memory architectures. In particular, the disclosure relates to the architecture of an Electrically Erasable and Programmable Read-Only Memory (EEPROM).

2. Description of the Related Art

Nonvolatile memories (NVM) allow data to be stored even when no power is applied. Conventional Electrically Erasable and Programmable memories are generally classified into two categories: EEPROMs on the one hand, and Flash-EEPROM or "Flash" memories on the other hand.

Memory cells of conventional EEPROMs comprise a floating-gate transistor and a selection transistor. The selection transistor has a control gate terminal connected to a word line, a first conduction terminal connected to a bit line and a second conduction terminal connected to a first conduction terminal of the floating gate transistor. The floating gate transistor has a control gate terminal connected to a control gate line.

Memory cells of conventional Flash memories only comprise a floating gate transistor that has a control gate connected to a word line and a first conduction terminal connected to a bit line.

It is well known that EEPROM memory cells are suitable to realize word-erasable memories. Conventionally, a "word" comprises a group of N memory cells whose floating gate transistors are connected to a common control gate line. The control gate line is linked to a column latch that allows an erase voltage to be simultaneously applied to all the control gate terminals of the floating gate transistors of the word. Memory cells belonging to other words of the memory have the control gate terminals of their floating gate transistors controlled by other control gate lines and column latches.

It is also well known that Flash memory cells are suitable to realize page-erasable memories, a "page" comprising all the memory cells of a row, since the control gate terminals of the memory cells of a row are interconnected and receive the same erase voltage.

Therefore, EEPROMs are generally used in applications where word-erasability is sought, while Flash memories are generally used in applications where high density is sought and word-erasability is not necessary. For example, EEPROMs are often used to store application data while Flash memories are used to store code (program data).

Another difference between EEPROM memories and Flash memories resides in the arrangement of the data within a row.

EEPROM memories generally comprise rows of memory cells in which data is stored in a manner corresponding to the logical architecture of the memory. For example, assuming that a row of the memory is designed to store M words $W_0$-$W_{M-1}$, each comprising N bits $B_0$-$B_{N-1}$, bits $B_0$-$B_{N-1}$ of the word $W_0$ are stored in a first column $C_0$, bits $B_0$-$B_{N-1}$ of the word $W_1$ are stored in a second column $C_1$, etc., and bits $B_0$-$B_{N-1}$ of the word $W_{M-1}$ are stored in the last column $C_{M-1}$ of the memory.

On the contrary, in a row of a Flash memory, all bits of same rank belonging to different words are generally stored in memory cells that are adjacent and belong to a same column. For example, assuming again that a row is designed to store M words $W_0$-$W_{M-1}$ and that each word comprises N bits $B_0$-$B_{N-1}$, all bits $B_0$ of the same rank 0 of words $W_0$-$W_{M-1}$ of the row are stored in a first column $C_0$, all bits $B_1$ of the same rank 1 of words $W_0$-$W_{M-1}$ are stored in a second column $C_1$, etc. and all bits $B_{N-1}$ of the same rank N-1 of words $W_0$-$W_{M-1}$ are stored in the last column $C_{N-1}$ of the memory.

To summarize, a memory comprising rows of M words of N bits may comprise M columns of N memory cells and N bit lines if it is a EEPROM memory, and may comprise N columns of M memory cells and M bit lines if it is a Flash memory.

This difference in architecture has an effect upon the connection of the bit lines to sense amplifiers provided to read the memory cells. No matter which type of memory architecture is used, each sense amplifier is generally dedicated to the reading of bits having the same rank, and the number of sense amplifiers is equal to the number of bits in a word.

If a memory with M words per row and N bits per word is realized according to the EEPROM architecture, the first sense amplifier $SA_0$ is connected to a first bit line $BL_0$ of the first column $C_0$, to a first bit line $BL_0$ of column $C_1$, etc., and to a first bit line $BL_0$ of the last column $C_{M-1}$. Likewise, the second sense amplifier $SA_1$ is connected to a second bit line $BL_1$ of column $C_0$, to a second bit line $BL_1$ of column $C_1$, etc., and to a second bit line $BL_1$ of the last column $C_{M-1}$, etc. The last sense amplifier $SA_{N-1}$ is connected to a last bit line $BL_{N-1}$ of column $C_0$, to a last bit line $BL_{N-1}$ of column $C_1$, etc., and to a last bit line $BL_{N-1}$ of the last column $C_{M-1}$.

If such a memory is realized according to the Flash architecture, a first sense amplifier $SA_0$ is connected to the M adjacent bit lines of the first column $C_0$, a second sense amplifier $SA_1$ is connected to the M adjacent bit lines of the second column $C_1$, etc., and a Nth sense amplifier $SA_{N-1}$ is connected to the M adjacent bit lines of the last column $C_{N-1}$.

Since the connection of the sense amplifiers to the bit lines is done through multiplexing lines, the length of the multiplexing lines is generally approximately equal to the width of the memory array in an EEPROM memory whereas in a Flash memory, it is approximately equal to the width of a column. Now, the longer a multiplexing line is, the greater a corresponding parasitic capacitance is, resulting in longer read access times and higher electrical consumption due to longer pre-charge periods and capacitance value.

Finally, since bits of the same word are stored in memory cells connected to adjacent bit lines in an EEPROM memory and are read simultaneously by the sense amplifiers, crosstalk may occur between the bit lines during a read operation.

Therefore, it is apparent that Flash architectures and EEPROM architectures have respective advantages and disadvantages that can be summarized as follows:

| FLASH | EEPROM |
| --- | --- |
| Sense amplifiers $S_0$-$S_{N-1}$ read bits $B_0$-$B_{N-1}$ of a word by means of non-adjacent bit lines | Sense amplifiers $S_0$-$S_{N-1}$ read bits $B_0$-$B_{N-1}$ of a word by means of adjacent bit lines |
| Short multiplexing lines to interconnect bit lines and sense amplifiers | Long multiplexing lines to interconnect bit lines and sense amplifiers |
| Lower parasitic capacitance | Higher parasitic capacitance |
| Lower electrical consumption during read cycle due to lower parasitic capacitance | Higher electrical consumption during read cycle due to higher parasitic capacitance |
| Shorter access time | Longer access time |
| No crosstalk or low crosstalk | Higher crosstalk |
| Page erasable | Word erasable |
| Higher density (one transistor per memory cell) | Lower density (two transistors per memory cell) |

So-called "embedded memories" are memories embedded within an integrated circuit comprising further components. For example, an integrated circuit for chip card may contain a microcontroller, I/O circuitry and an embedded memory. In such embedded memory applications, it is generally desired that the embedded memory can be used both to store program data and application data, to avoid having to provide two different memories, one to store program data and the one other to store application data. For this reason, embedded memories must address different contradictory needs. For example, an embedded conventional EEPROM is convenient to store data but offers mediocre electrical consumption efficiency when data are read, due to the parasitic capacitance of the multiplexing lines.

Therefore, it may be desired to provide a memory architecture optimized for embedded memory applications.

BRIEF SUMMARY

Embodiments of the disclosure relate to an electrically erasable and programmable memory comprising rows of memory cells configured to store N-bits words, bit lines and word lines, wherein a memory cell comprises a selection transistor having a control terminal connected to a word line and a conduction terminal connected to a bit line, and a floating gate transistor having a control gate terminal to receive an erase voltage, and wherein a row of memory cells comprises a first group of memory cells to store collectively erasable words, and at least one second group of memory cells to store one individually erasable word.

According to an embodiment, the first group of memory cells comprises $2^m$ collectively erasable words, m being an integer at least equal to 3.

According to an embodiment, the memory cells of the first group have the control gate terminals of their floating gate transistors interconnected or electrically linked, and the memory cells of the second group have the control gate terminals of their floating gate transistors interconnected or electrically linked and not interconnected or electrically linked to the floating gate terminals of the memory cells of the first group.

According to an embodiment, the control gate terminals of the floating gate transistors of the memory cells of the first group of a row are linked to a first common control gate line through first control gate transistors, and the control gate terminals of the floating gate transistors of the memory cells of the second group of a row are linked to a second common control gate line through second control gate transistors.

According to an embodiment, the electrically erasable and programmable memory comprises a row decoder to drive word lines of the memory, the control gate terminals of all the floating gate transistors of the memory cells of the first group of a row are connected to a first common control gate line which is driven by the row decoder, and the control gate terminals of all the floating gate transistors of the memory cells of the second group of a row are connected to a second common control gate line different from the first control gate line and driven by the row decoder.

According to an embodiment, the electrically erasable and programmable memory comprises row selection means and erase control means configured to simultaneously erase the memory cells of the first group of a selected row without erasing the memory cells of the second group of the selected row, or to simultaneously erase the memory cells of the second group of a selected row without erasing the memory cells of the first group of the selected row.

According to an embodiment, the electrically erasable and programmable memory comprises sense amplifiers to read the memory cells, and memory cells which store bits of the same rank of the different words of a row, no matter which group they belong to, are linked to the same sense amplifier through adjacent bit lines.

According to an embodiment, a row of memory cells comprises subgroups of adjacent memory cells of the first group, memory cells of the second group, arranged in alternation with the subgroups of memory cells of the first group, and each sense amplifier is linked to the adjacent memory cells of one subgroup of memory cells of the first group and to one memory cell of the second group.

According to an embodiment, the electrically erasable and programmable memory comprises one first control gate transistor per subgroup of memory cells of the first group, and one second control gate transistor per memory cell of the second group.

According to an embodiment, the electrically erasable and programmable memory comprises one first control gate transistor per two subgroups of memory cells of the first group, and one second control gate transistor per two memory cells of the second group.

According to an embodiment, each sense amplifier is linked to bit lines through word selection transistors.

Embodiments of the present disclosure also relate to an integrated circuit on a semiconductor chip, comprising an electrically erasable and programmable memory according to the disclosure.

According to an embodiment, the integrated circuit is configured to store program data in memory cells of the first group and to store application data in memory cells of the second group.

One embodiment is a handheld device, comprising an integrated circuit on a semiconductor chip, the integrated circuit comprising an electrically erasable and programmable memory according to the disclosure.

BRIEF DESCRIPTION OF THE SEVERAL VIEWS OF THE DRAWINGS

Embodiments of an EEPROM memory according to the disclosure will be described in the following description, in relation with but not limited to the following figures, in which.

DETAILED DESCRIPTION

Figure 1:
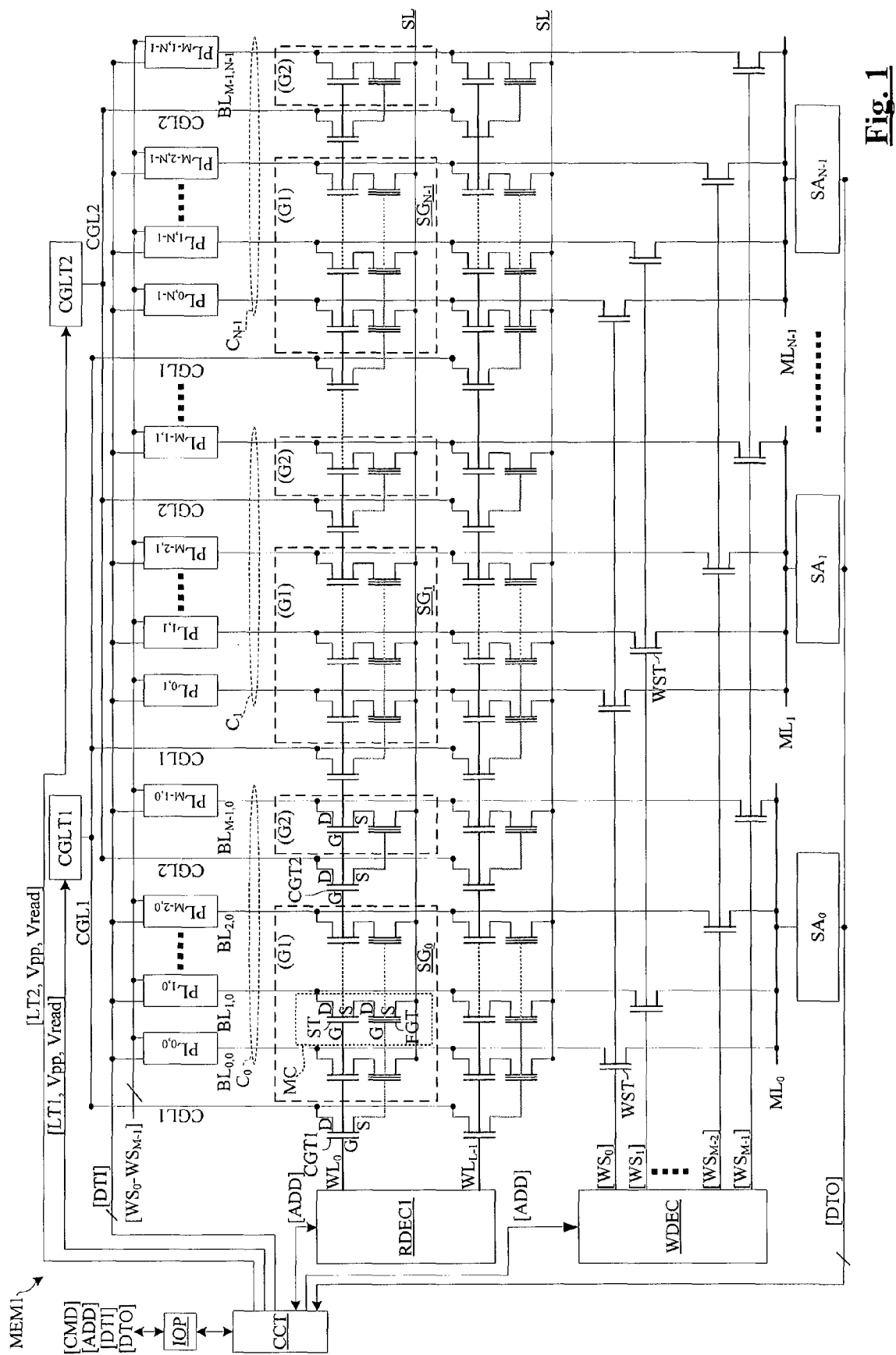
FIG. 1 shows a first embodiment of a memory according to the disclosure.
Figure 3:
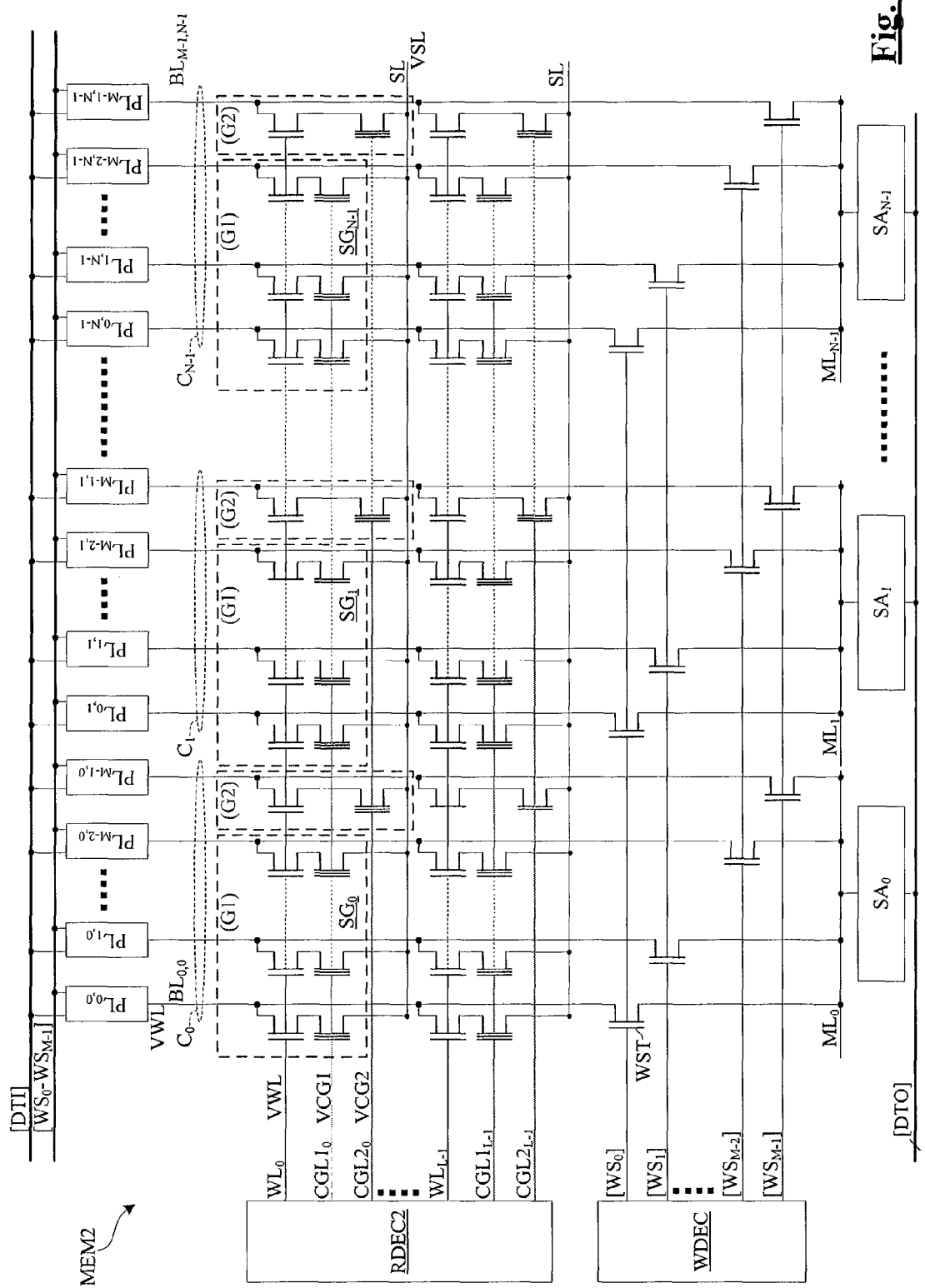
FIG. 3 shows a second embodiment of a memory according to the disclosure.
Figure 4:
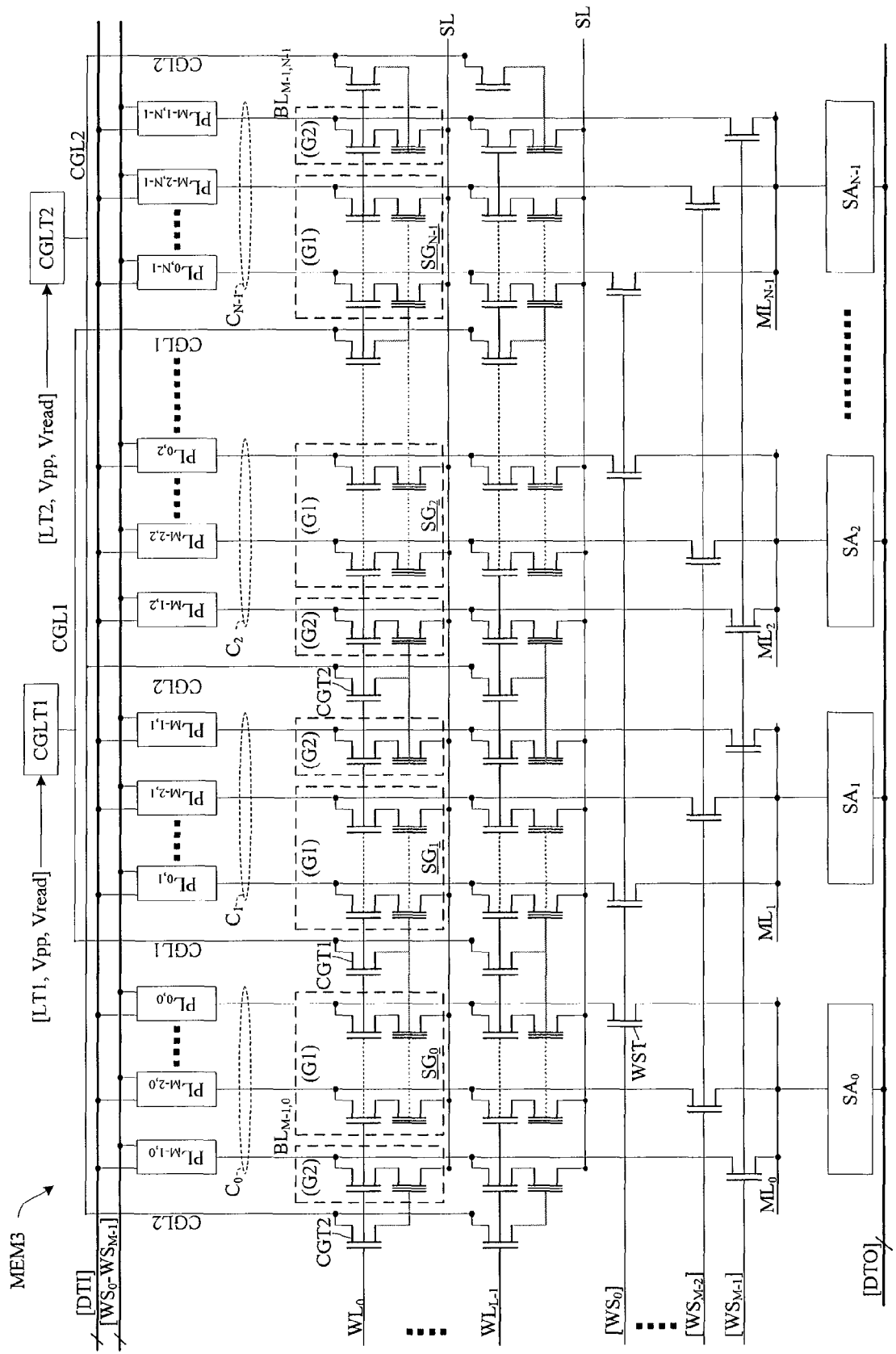
FIG. 4 shows a third embodiment of a memory according to the disclosure.

Embodiments MEM1, MEM2, MEM3 of a memory according to the disclosure are respectively shown in FIGS. 1, 3, 4. Each memory MEM1, MEM2, MEM3 has a memory array that comprises memory cells MC, bit lines BL, and word lines WL. Each memory cell comprises a selection transistor ST and a floating gate transistor FGT, here of the NMOS type. The selection transistor ST of each memory cell has a drain terminal (D) connected to a bit line BL, a gate terminal (G) connected to a word line WL, and a source terminal (S) connected to a drain terminal (D) of the floating gate transistor FGT of the memory cell. Each floating gate transistor has a source terminal (S) connected to a source line SL.

Memories MEM1 and MEM3 also comprise control gate transistors CGT. The floating gate transistor of each memory cell has a control gate terminal (G) connected to a source terminal (S) of a control gate transistor CGT. The control gate transistor CGT has a control gate terminal (G) connected to the same word line WL as the selection transistors ST of the memory cells to which it is connected.

The erase, program, and read of the memory cells MC are performed by means of a row decoder RDEC1 (MEM1, MEM3) or RDEC2 (MEM2), a word decoder WDEC, program latches PL, sense amplifiers SA and control gate latches CGLT (MEM1, MEM3). Multiplexing lines ML# ($ML_0$, $ML_1$, ... $ML_{N-1}$) are provided to connect the input of each sense amplifier SA# to corresponding bit lines. A control circuit CCT including buffer circuits and voltage generators may be provided to control these different elements and to receive and execute erase, program, or read commands CMD, including addresses ADD indicating for which memory cells said commands are to be executed, and input data DTI to be stored in the memory. In an embodiment, the control circuit CCT receives write commands accompanied by addresses and data and sequences corresponding erase and program operations. The control circuit CCT also outputs data DTO that have been read in the memory by the sense amplifiers SA. An input/output port IOP may be provided to receive such commands, addresses, input data DTI from the outside and to provide output data DTO to the outside.

In the example embodiments shown in FIGS. 1, 3, 4 the memory array has L word lines $WL_0$ to $WL_{L-1}$ and therefore comprises L rows of memory cells, a row comprising all the memory cells that are connected to the same word line. Each row is here provided to store M words $W_0$-$W_{M-1}$ each having N bits $B_0$-$B_{N-1}$, for example 8, 16 or 32 bits. The logic architecture of the memory array is described in Table 1 below.

TABLE 1

| Row 0($WL_0$) | $W_0$ | $W_1$ | ... | $W_{M-2}$ | $W_{M-1}$ |
|---|---|---|---|---|---|
| Row 1 ($WL_1$) | $W_0$ | $W_1$ | ... | $W_{M-2}$ | $W_{M-1}$ |
| ... | | | | | |
| Row $L_{-1}$($WL_{L-1}$) | $W_0$ | $W_1$ | ... | $W_{M-2}$ | $W_{M-1}$ |

Since each word comprises N bits, memories MEM1, MEM2, MEM3 comprise N sense amplifiers $SA_0$, $SA_1$, ... $SA_{N-1}$. Each sense amplifier is arranged to read a bit in a word selected by means of the row decoder RDEC1 or RDEC2 and the word decoder WDEC. More specifically, sense amplifier $SA_0$ is arranged to read bit $B_0$ of a selected word, sense amplifier $SA_1$ is arranged to read bit $B_1$ of the selected word, etc, and sense amplifier $SA_{N-1}$ is arranged to read bit $B_{N-1}$ of the selected word.

According to a first aspect of the disclosure, each row comprises M-X words that are erasable simultaneously and are not erasable individually, and X words that are erasable individually and distinctively from the other words of the row. To that effect, each row comprises one first group G1 of memory cells to store bits $B_0$ to $B_{N-1}$ of the collectively erasable words, and X second groups G2 of memory cells. Each second group G2 is provided to store bits $B_0$ to $B_{N-1}$ of one individually erasable word. Group G1 therefore comprises N*(M-X) memory cells and group G2 comprises N*X memory cells.

In the embodiments shown in FIGS. 1, 3, 4 only word $W_{M-1}$ is erasable individually in each row, so that X=1. Therefore, the memory cells of group G1 are provided to store bits $B_0$ to $B_{N-1}$ of words $W_0$ to $W_{M-2}$ and the memory cells of group G2 are provided to store bits $B_0$ to $B_{N-1}$ of word $W_{M-1}$. Group G1 comprises N*(M-1) memory cells and group G2 comprises N memory cells.

In order to be simultaneously erasable, all memory cells of group G1 have the control gates of their floating gate transistors linked together or electrically interconnected, in a manner that differs in the three embodiments MEM1, MEM2, MEM3 and that will be described in more detail below. Likewise, all the memory cells of group G2 have the control gates of their floating gate transistors linked together or electrically interconnected in a manner that differs in the three embodiments MEM1, MEM2, MEM3.

The memory cells of group G1 form the equivalent of a page of a page-erasable memory, while the memory cells of group G2 form the equivalent of a word of a word-erasable memory. In other words, memories MEM1, MEM2, MEM3 can be regarded as page-erasable memories as far as words $W_0$ to $W_{M-2}$ of each row are concerned, and as word-erasable memories as far as word $W_{M-1}$ of each row is concerned. In some embodiments, group G1 includes at least 8 words (M-1=8), 16 words (M-1=16) or more, so that M-1 can be written in the form $2^m$ with m at least equal to 3. In such embodiments, memories MEM1, MEM2, MEM3 can be regarded as page-erasable memories having $2^m$ collectively erasable words per page, and having at least one additional individually erasable word in each row.

According to a second aspect of the disclosure, the memory arrays of memories MEM1, MEM2, MEM3 have a "Flash-like" structure, that is to say the sense amplifiers SA are linked to bit lines BL that are adjacent in the memory array. This second aspect of the disclosure is implemented together with the first aspect of the disclosure, but may be implemented independently of the first aspect of the disclosure in other embodiments.

It is apparent in FIGS. 1, 3, 4 that the multiplexing lines ML# are of a reduced length, thereby reducing parasitic capacitance. In a conventional EEPROM, and as explained above, sense amplifiers are connected to bit lines arranged throughout the entire memory array so that the lengths of the multiplexing lines substantially correspond to the width of the memory array. Another advantage of this arrangement of memory cells is that the different sense amplifiers do not read adjacent bit lines simultaneously, thereby reducing crosstalk. Therefore, a memory embodying the second aspect of the disclosure provides fast access times and low read power consumption.

FIRST EMBODIMENT

Figure 2:
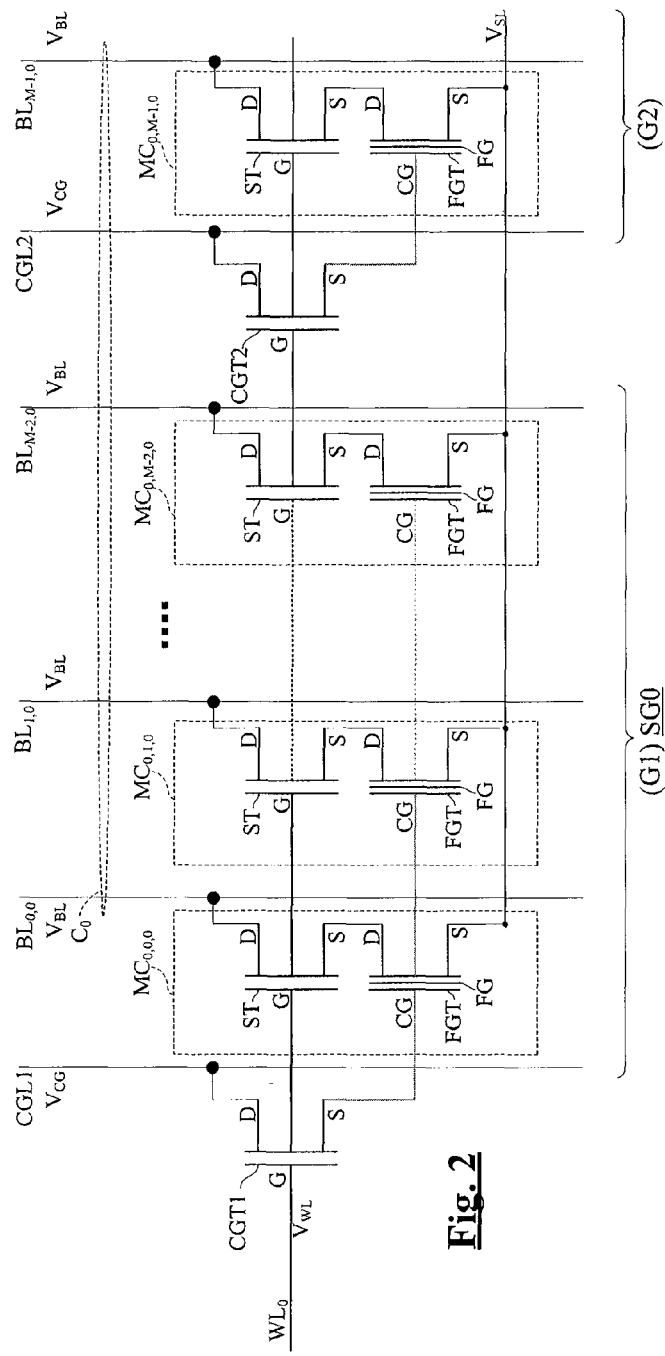
FIG. 2 shows in further detail a portion of the memory of FIG. 1.

Memory MEM1 will now be described in further detail with reference to FIG. 1, as well as FIG. 2 which shows a portion of a row of memory MEM1.

As previously indicated, a row of memory MEM1 comprises N*M memory cells MC, among which N*(M-1) belong to group G1 and N belong to group G2. In order to implement the Flash-like structure, group G1 is divided into N subgroups $SG_0$, $SG_1$ ... $SG_{N-1}$, each comprising M-1 memory cells, and the memory cells of group G2 are arranged individually in alternation with the subgroups SG#.

Each subgroup SG# is associated with a control gate transistor CGT1, so that N-1 control gate transistors CGT1 are provided within a row. In each subgroup, the control gate terminals (G) of the floating gate transistors are connected to the source terminal (S) of the control gate transistor CGT1 associated with the subgroup. To allow all the memory cells of group G1 to be simultaneously erased, the drain terminals (D) of all the control gate transistors CGT1 are connected to a common control gate latch CGLT1 through a common control gate line CGL1.

Likewise, each memory cell of group G2 is associated with a control gate transistor CGT2, so that N-1 control gate transistors CGT2 are provided within a row. For each memory cell of group G2, the source terminal (S) of the associated transistor CGT2 is connected to the control gate of the floating gate transistor of the memory cell. To allow all the memory cells of group G2 to be simultaneously erased, the drain terminals of all the control gate transistors CGT2 are connected to a common control gate latch CGLT2 through a common control gate line CGL2.

To summarize, each row comprises, from left to right (Cf. FIG. 1), a control gate transistor CGT1 connected to M-1 memory cells of group G1 (subgroup $SG_0$), a control gate transistor CGT2 connected to one memory cell of group G2, a control gate transistor CGT1 connected to M-1 memory cells of group G1 (subgroup SG1), a control gate transistor CGT2 connected to one memory cell of group G2, etc.

This repetitive arrangement of memory cells forms N columns $C_0$ to $C_{N-1}$ within the memory array. Each column C# comprises M bit lines linked to a corresponding sense amplifier SA# through word selection transistors WST. In each row, each column comprises M-1 memory cells of a subgroup of group G1 and one memory cell of group G2. For example, column $C_0$ comprises M bit lines $BL_{0,0}$ to $BL_{M-1,0}$ ($BL_{W\#,C\#}$) linked to sense amplifier $SA_0$, column C1 comprises M bit lines linked to sense amplifier $SA_1$, etc. up to column $C_{N-1}$, the M bit lines of which are linked to sense amplifier $SA_{N-1}$.

Memory cells belonging to the same column are used to store bits of the same rank belonging to different words $W_0$ to $W_{M-1}$ of the row. For example, and as shown in FIG. 2, memory cells $MC_{0,0,0}$, $MC_{0,1,0}$, to $MC_{0,M-2,0}$ ($MC_{L\#,W\#,C\#}$) of column $C_0$ in row 0 (i.e., memory cells connected to word line $WL_0$) store bits $B_0$ of words $W_0$ to $W_{M-2}$, which are erasable simultaneously, and the last memory cell $MC_{0,M-1,0}$ of the column stores bit $B_0$ of word $W_{M-1}$, which is individually erasable.

Since the different bit lines of a column C# correspond to bits belonging to different words, the word selection transistors WST that link the bit lines of the column C# to the corresponding sense amplifier SA# are driven by different word selection signals $WS_0$ to $WS_{M-1}$ supplied by the word decoder WDEC.

In order to perform erase, program, or read operations, the row decoder RDEC1, the word decoder WDEC, the program latches PL and the sense amplifiers SA are controlled by the control circuit CCT. The control circuit CCT forwards to the row decoder RDEC1 the Most Significant Bits MSB of addresses ADD sent to the memory, forwards to the word decoder WDEC the Least Significant Bits LSB of address ADD, and forwards to the program latches PL bits to be programmed in the memory (data DTI). The sense amplifiers forward to the control circuit CCT the bits $B_0$-$B_{N-1}$ of a word read in the memory array (data DTO).

The program latches PL also receive the word selection signals $WS_0$-$WS_{M-1}$ supplied by the word decoder WDEC, so that only the program latches corresponding to a word address ADD received by the control circuit CCT temporarily store the bits to be programmed in the memory array. The control circuit CCT also controls the control gate latches CGLT1 and CGLT2, and supplies them with different voltages.

Erase, Program, and Read Operations

Table 2 below describes example voltages applied to the memory array during erase, program, and read operations.

TABLE 2

|  | VBL | VWL | VCG | VSL |
|---|---|---|---|---|
| ERASE | HZ | Vpp | Vpp | 0 |
| PROGRAM | Vpp | Vpp | 0 | HZ |
| READ | V1 < Vread (e.g., 1 V) | V2 > Vread (e.g., Vread + 0.8 V) | Vread | 0 |

VBL is a voltage applied to selected bit lines by the program latches PL during a program operation, or the voltage applied to selected bit lines by the sense amplifier SA during a read operation. Typically, Vpp is about 10 to 15 V, whereas Vcc is about 2 to 5 V. During erase operations, the bit lines are set at high impedance (HZ) since the program latches PL and the word selection transistors WST are in the non-conducting state.

VWL is a voltage applied to a selected word line by the row decoder RDEC1 during erase, program, or read operations.

VCG is a control gate voltage applied to the control gate terminals of all memory cells of group G1 or G2 of a selected row by the control gate latches CGLT1 or CGLT2. Since VCG is applied to the memory cells through the control gate transistors CGT1 or CGT2, only the memory cells connected to the word line selected by the row decoder receive voltage VCG because only the control gate transistors CGT1 or CGT2 of the row are set in the conducting state by voltage VWL.

Finally, VSL is the source voltage applied to the source terminals of the floating gate terminals of all the memory cells of the memory array by the control circuit CCT, or at least to the source line corresponding to the selected row designated by the address ADD.

Page Erase

An example of a page erase operation will now be described assuming that circuit CCT receives a first type page erase command with the address of a row (the MSB of address ADD) that designates a word line, for example $WL_0$ (Row 0). It is assumed that this first type of page erase command aims to erase the memory cells of group G1 only. In that case, the following steps are performed:

Circuit CCT activates the control gate latch CGLT1 with a control signal LT1, and supplies it as well as the row decoder RDEC1 with an erase voltage Vpp. Control gate latch CGLT2 remains deactivated and its output is set to 0 or HZ. Circuit CCT also sets to 0 all the source lines of the memory array or at the least source line of row 0, so that the source terminals of the floating gate transistors of row 0 are set to 0 (VSL=0);

The control gate latch CGLT1 applies the control gate voltage VCG to Vpp on the control gate line CGL1, so that voltage Vpp is received by the drain terminals of all the control gate transistors CGT1 of each row and column;

The row decoder RDEC1 decodes the MSB of address ADD and applies voltage Vpp to the designated word line, for example $WL_0$, so that control gate transistors CGT1 are set in the conducting state and forward voltage Vpp to the control gate terminals of the floating gate transistors of all the memory cells of group G1 connected to word line $WL_0$ (VCG=Vpp).

As a result, electric charges are extracted, by Fowler Nordheim tunneling effect, from the floating gate of the floating gate transistors of group G1 connected to word line $WL_0$ and the memory cells are erased. The memory cells of group G2 are not erased because voltage Vpp is not supplied by control gate latch CGLT2.

Word Erase

Similar steps are performed on the memory cells of group G2 instead of memory cells of group G1 if circuit CCT receives a word erase command with the address of a word (the full address ADD). In that case, circuit CCT activates control gate latch CGLT2 with a control signal LT2, supplies the latch CGLT2 and the row decoder RDEC1 with the erase voltage Vpp, and sets to 0 all the source lines of the memory array or at least the source line corresponding to the selected row designated by the address ADD. The row decoder applies voltage Vpp to the word line designated by the address ADD and the control gate latch CGLT2 applies voltage Vpp to all the control gate transistors CGT2, so that all memory cells of group G2 connected to the selected word line receive voltage Vpp and are erased.

Program

When memory cells are to be programmed, for example to store a word in row 0, N program latches PL are activated by the word decoder WDEC and latch bits $B_0$-$B_{N-1}$ (input data DTI). The program latches that have latched a bit whose logic value corresponds to the programmed state of a memory cell (0 or 1, by convention) apply voltage Vpp (VBL=Vpp) to the bit lines to which the memory cells are connected. Voltage Vpp is therefore applied to the drain terminals of all of the selection transistors ST connected to that bit line. The row decoder RDEC1 applies voltage Vpp to word line $WL_0$, so that all the selection transistors ST are set in the conducting state. Therefore, the floating gate transistors of the memory cells connected to the activated bit lines receive voltage Vpp. As a result, electric charges are injected, by Fowler Nordheim tunneling effect, into the floating gates of these floating gate transistor and the memory cells are programmed.

Read

In order to read memory cells connected to a word line such as word line $WL_0$, no matter which group G1 or G2 they belong to, the control gate latches CGLT1 and CGLT2 simultaneously apply the read voltage Vread to the control gate lines CGL1 and CGL2 and the row decoder applies voltage VWL to the selected word line $WL_0$. Therefore, all the floating gate transistors of the row receive voltage Vread on their control gate. Simultaneously, the sense amplifiers $SA_0$-$SA_{N-1}$ apply voltage VBL to the bit lines to which the memory cells to be read are connected, through N word selection transistors WST that are set in the conducting state by the word decoder WDEC.

Full-Page Erase

In addition to the word erase command for the memory cells of group G2 and to the first type of page erase command for the memory cells of group G1, a second type of page erase command may be provided, aiming to erase all the memory cells of groups G1 and G2 within a row. The execution of such a command requires simultaneous activation of both control gate latches CGLT1, CGLT2.

Embodiment with X Individually Erasable Words

As indicated above, memory MEM1 may also comprise X individually erasable words per row (i.e., X groups G2). This variant requires additional control gate latches CGLT2 and additional control gate transistors per row and additional individually erasable word. In such embodiment, the selection and activation of the control gate latches CGLT2 for each individually erasable word may be controlled by the word decoder WDEC during an erase operation.

SECOND EMBODIMENT

Memory MEM2 will now be described in further detail with reference to FIG. 3. Memory MEM2 has a memory array which differs from that of memory MEM1 in that the control gate transistors CGT1, CGT2 and the control gate latches CGLT1, CGLT2 are not present. Therefore, in this embodiment each row comprises, from left to right, M-1 memory cells of group G1 (subgroup $SG_0$), one memory cell of group G2, M-1 memory cells of group G1 (subgroup SG1), one memory cell of group G2, etc.

Memory MEM2 comprises a row decoder RDEC2 designed to control separately, in each row, the control gates of the floating gates transistors of memory cells of group G1 and, on the other hand, the control gates of the floating gates transistors of memory cells of group G2.

Therefore, each row of rank L# comprises control gate lines $CGL1_{L\#}$, $CGL2_{L\#}$ connected to the row decoder RDEC2. Control gate line $CGL1_{L\#}$ is connected to the control gates of the floating gates transistors of the memory cells of group G1 while control gate line $CGL2_{L\#}$ is connected to the control gates of the floating gate transistors of the memory cells of group G2.

The other elements of the memory, such as the input/output port IOP, the control circuit CCT, the word decoder WDEC, the word selection transistors WST, the program latches PL, the multiplexing lines ML, and the sense amplifiers SA are essentially the same as those previously described in relation with FIG. 1 and are connected or linked to the memory array in a similar manner (the input/output port IOP and the control circuit CCT are not shown again).

The skilled person will note that the control gate transistors CGT1, CGT2 that have been removed from the memory array may be integrated within the row decoder, represented as a block, at the rate of two control gate transistors per row: one to drive control gate line $CGL1_{L\#}$ and the other to drive control gate line $CGL2_{L\#}$. Likewise, the latch function for applying voltages to the control gates lines is here performed by the row decoder.

Table 3 below describes example voltages applied to the memory array during erase, program, or read operations.

TABLE 3

|  | VBL | VWL | VCG1 | VCG2 | VSL |
| --- | --- | --- | --- | --- | --- |
| ERASE | HZ | 0 | Vpp | Vpp | 0 |
| PROGRAM | Vpp | Vpp | 0 | 0 | HZ |
| READ | V1 < Vread (e.g., 1 V) | V2 > V1 (e.g., V1 + 0.8 V) | Vread | Vread | 0 |

Voltages VBL, VWL and VSL have already been described. Voltage VCG1 is the control gate voltage applied to the control gate terminals of all memory cells of group G1 of a selected row by the control gate line $CGL1_{L\#}$ during erase, program, or read operations. Voltage VCG2 is the control gate voltage applied to the control gate terminals of all memory cells of group G2 of a selected row by the control gate line $CGL2_{L\#}$ during erase, program, or read operations. During the execution of a page erase command of the first type or the execution of a word erase command, VCG1 is equal to Vpp and VCG2 is set to high impedance or to 0, or vice-versa. Voltages VCG1 and VCG2 are both set to Vpp for the execution of the second type of page erase command (full-page erase), aiming to erase all the memory cells of groups G1 and G2 within a row.

As indicated above, memory MEM2 may also comprise X individually erasable words per row (i.e., X groups G2). This variant requires one additional control gate line CGL2 per row and additional individually erasable word.

THIRD EMBODIMENT

Referring to FIG. 4, Memory MEM3 differs from MEM1 in that its memory array has a "flipped" structure. Two subsequent subgroups $SG_i$, $SG_{i+1}$, for example $SG_0$ and $SG_1$, are arranged side by side and share one common control gate transistor CGT1 which is arranged between them and is connected to both the control gates of the floating gate transistors of the memory cells of the first subgroup $SG_i$, for example $SG_0$, and to the control gates of the floating gate transistors of the memory cells of the second subgroup $SG_{i+1}$, for example $SG_1$. Likewise, two successive memory cells of group G2 are arranged side by side and share one common control gate transistor CGT2 which is arranged between them and is connected to the control gates of the floating gate transistors of the two memory cells, with the exception of the first and last memory cells of group G2. Consequently, the architecture of a word line is of the type G2, G1-G1, G2-G2, G1-G1, G2-G2, etc, G1-G1, G2. The number of control gate transistors CGT1, CGT2 per row is thereby reduced. The first and last memory cells of group G2, corresponding to bits $B_0$ and $B_{N-1}$ of the individually erasable word in each word line, are each individually connected to a control gate transistor CGT2.

Therefore, each row comprises, from left to right: a control gate transistor CGT2, a memory cell of group G2, M-1 memory cells of group G1, a control gate transistor CGT1, M-1 memory cells of group G1, a memory cell of group G2, a control gate transistor CGT2, a memory cell of group G2, . . . a control gate transistor CGT2, and a memory cell of group G2.

The other elements of the memory, such as the input/output port IOP, the control circuit CCT, the row decoder RDEC1, the word decoder WDEC, the word selection transistors WST, the program latches PL, the multiplexing lines ML, and the sense amplifiers SA are essentially the same as those previously described in relation with FIG. 1 and are not shown in FIG. 4. The erase, program, or read operations are performed in a similar manner as described above in relation with Table 1, and will not be described again.

Figure 5:
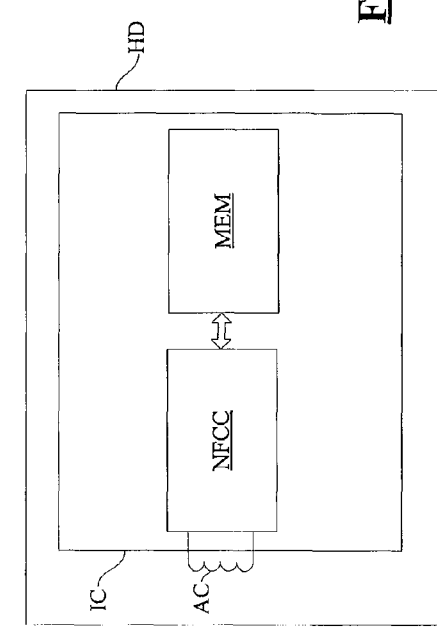
FIG. 5 shows an application example of a memory according to the disclosure.

It will appear to the skilled person that a memory according to the disclosure is susceptible to various embodiments and applications. As an example, FIG. 5 schematically shows a passive contactless handheld device HD comprising an integrated circuit IC, within which a memory MEM according to one of the above-described embodiments is embedded. In one embodiment, the handheld device HD may be a contactless chip card, a tag, a mobile phone, a personal digital assistant, etc, and has a communication controller to which the memory MEM is connected, for example an NFC Controller NFCC (Near Field Communication) with an antenna coil AC to exchange data by inductive coupling and load modulation, or with a UHF antenna (not shown) to exchange data by electric coupling and backscattering. The handheld device is configured to communicate with an external device such as a contactless card or tag reader, a POS (Point of Sale), another NFC mobile phone, etc. The memory MEM is used both to store code (in particular application programs) and application data. Application data can be stored in the last word of each row, which is individually erasable. Therefore, time is saved when an application program must store small amount of data in the memory. Code can be stored in the collectively erasable words of the memory, so that time is also saved when large amounts of data must be stored in the memory, for example newly downloaded application programs. In addition, thanks to the Flash-like architecture of the memory, low power consumption can also be achieved during read operation, so that the distance of communication between the contactless handheld device HD and the remote device (POS, reader, etc.) is increased.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electrically erasable and programmable memory comprising:
   rows of memory cells, configured to store N-bits words;
   bit lines; and
   word lines,
   wherein each memory cell comprises:
      a selection transistor having a control terminal connected to a corresponding one of the word lines and a conduction terminal connected to a corresponding one of the bit lines, and
      a floating gate transistor having a control gate terminal to receive an erase voltage,
   wherein each row of memory cells comprises:
      a first group of memory cells configured to store collectively erasable words, and
      a second group of memory cells configured to store one individually erasable word.

2. An electrically erasable and programmable memory according to claim 1, wherein the first group of memory cells is configured to store $2^m$ collectively erasable words, m being an integer greater than or equal to 3.

3. An electrically erasable and programmable memory according to claim 1, wherein:
   the control gate terminals of the memory cells of the first group are interconnected or electrically linked to each other, and
   the control gate terminals of the memory cells of the second group are interconnected or electrically linked to each other and are not interconnected or electrically linked to the floating gate terminals of the memory cells of the first group.

4. An electrically erasable and programmable memory according to claim 1, further comprising first and second common control gate lines, wherein each row includes:
   first control gate transistors configured to couple the control gate terminals of the floating gate transistors of the memory cells of the first group of the row to the first common control gate line, and
   second control gate transistors configured to couple the control gate terminals of the floating gate transistors of the memory cells of the second group of the row to the second common control gate line.

5. An electrically erasable and programmable memory according to claim 1, comprising:
   first and second common control gate lines; and
   a row decoder configured to drive the word lines of the memory and the first and second common control gate lines, wherein:
      the control gate terminals of all the floating gate transistors of the memory cells of the first group of a row are coupled to the first common control gate line, and
      the control gate terminals of all the floating gate transistors of the memory cells of the second group of a row are coupled to the second common control gate line.

6. An electrically erasable and programmable memory according to claim 1, comprising erasing means for simultaneously erasing the memory cells of the first group of a selected row of the rows without erasing the memory cells of the second group of the selected row, or simultaneously erasing the memory cells of the second group of the selected row without erasing the memory cells of the first group of the selected row.

7. An electrically erasable and programmable memory according to claim 1, comprising sense amplifiers configured to read the memory cells, the sense amplifiers being respectively coupled to sets of the memory cells, wherein for each set, the memory cells of the set are configured to store bits of a same rank of the words of one of the rows, no matter to which group the memory cells belong, and are coupled to the respective sense amplifier through immediately adjacent bit lines.

8. An electrically erasable and programmable memory according to claim 7, wherein:
   each row of memory cells comprises:
      subgroups of immediately adjacent memory cells of the first group,
      memory cells of the second group, arranged in alternation with the subgroups of memory cells of the first group; and
   each sense amplifier is coupled to the immediately adjacent memory cells of one subgroup of memory cells of the first group and to one memory cell of the second group, wherein the one subgroup and the one memory cell of the second ground together comprise the set of memory cells coupled to the sense amplifier.

9. An electrically erasable and programmable memory according to claim 8, wherein each row includes:
   a plurality of first control gate transistors respectively coupled to the subgroups of memory cells of the first group, and
   a plurality of second control gate transistors respectively coupled to the memory cells of the second group.

10. An electrically erasable and programmable memory according to claim 8, wherein each row includes:
    a plurality of first control gate transistors respectively coupled to two subgroups of memory cells of the first group, and
    a plurality of second control gate respectively coupled to two memory cells of the second group.

11. An electrically erasable and programmable memory according to claim 7, further comprising word selection transistors coupling one of the sense amplifiers to the immediately adjacent bit lines.

12. An integrated circuit on a semiconductor chip, comprising:
    a controller; and
    an electrically erasable and programmable memory (EEPROM) coupled to the controller and including:
       rows of memory cells, configured to store N-bits words;
       bit lines; and
       word lines,
       wherein each memory cell comprises:
          a selection transistor having a control terminal connected to a corresponding one of the word lines and a conduction terminal connected to a corresponding one of the bit lines, and
          a floating gate transistor having a control gate terminal to receive an erase voltage,
       wherein each row of memory cells comprises:
          a first group of memory cells configured to store collectively erasable words, and
          a second group of memory cells configured to store one individually erasable word.

13. An integrated circuit according to claim 12, wherein the memory cells of each first group are configured to store program data and the memory cells of each second group are configured to store application data.

14. An integrated circuit according to claim 12, wherein:
    the control gate terminals of the memory cells of the first group are interconnected or electrically linked to each other, and
    the control gate terminals of the memory cells of the second group are interconnected or electrically linked to each other and are not interconnected or electrically linked to the floating gate terminals of the memory cells of the first group.

15. An integrated circuit according to claim 12, wherein the EEPROM includes first and second common control gate lines, wherein each row includes:
    first control gate transistors configured to couple the control gate terminals of the floating gate transistors of the memory cells of the first group of the row to the first common control gate line, and
    second control gate transistors configured to couple the control gate terminals of the floating gate transistors of the memory cells of the second group of the row to the second common control gate line.

16. An integrated circuit according to claim 12, wherein the EEPROM includes:
    first and second common control gate lines; and
    a row decoder configured to drive the word lines of the memory and the first and second common control gate lines, wherein:
       the control gate terminals of all the floating gate transistors of the memory cells of the first group of a row are coupled to the first common control gate line, and
       the control gate terminals of all the floating gate transistors of the memory cells of the second group of a row are coupled to the second common control gate line.

17. An integrated circuit according to claim 12, wherein the EEPROM includes erasing means for simultaneously erasing the memory cells of the first group of a selected row of the rows without erasing the memory cells of the second group of the selected row, or simultaneously erasing the memory cells of the second group of the selected row without erasing the memory cells of the first group of the selected row.

18. An integrated circuit according to claim 12, wherein the EEPROM includes sense amplifiers configured to read the memory cells, the sense amplifiers being respectively coupled to sets of the memory cells, wherein for each set, the memory cells of the set are configured to store bits of a same rank of the words of one of the rows, no matter to which group the memory cells belong, and are coupled to the respective sense amplifier through immediately adjacent bit lines.

19. An integrated circuit according to claim 18, wherein:
    each row of memory cells comprises:
       subgroups of immediately adjacent memory cells of the first group,
       memory cells of the second group, arranged in alternation with the subgroups of memory cells of the first group; and
    each sense amplifier is coupled to the immediately adjacent memory cells of one subgroup of memory cells of the first group and to one memory cell of the second group, wherein the one subgroup and the one memory cell of the second ground together comprise the set of memory cells coupled to the sense amplifier.

20. An integrated circuit according to claim 19, wherein each row includes:
    a plurality of first control gate transistors respectively coupled to the subgroups of memory cells of the first group, and a plurality of second control gate transistors respectively coupled to the memory cells of the second group.

21. A handheld device, comprising:
an antenna; and
an integrated circuit on a semiconductor chip, the integrated circuit including:
   a controller coupled to the antenna; and
   an electrically erasable and programmable memory (EEPROM) coupled to the controller and including:
      rows of memory cells, configured to store N-bits words;
      bit lines; and
      word lines,
      wherein each memory cell comprises:
         a selection transistor having a control terminal connected to a corresponding one of the word lines and a conduction terminal connected to a corresponding one of the bit lines, and
         a floating gate transistor having a control gate terminal to receive an erase voltage,
      wherein each row of memory cells comprises:
         a first group of memory cells configured to store collectively erasable words, and
         a second group of memory cells configured to store one individually erasable word.

22. A handheld device according to claim 21, wherein:
the control gate terminals of the memory cells of the first group are interconnected or electrically linked to each other, and
the control gate terminals of the memory cells of the second group are interconnected or electrically linked to each other and are not interconnected or electrically linked to the floating gate terminals of the memory cells of the first group.

23. A handheld device according to claim 21, wherein the EEPROM includes first and second common control gate lines, wherein each row includes:
   first control gate transistors configured to couple the control gate terminals of the floating gate transistors of the memory cells of the first group of the row to the first common control gate line, and
   second control gate transistors configured to couple the control gate terminals of the floating gate transistors of the memory cells of the second group of the row to the second common control gate line.

24. A handheld device according to claim 21, wherein the EEPROM includes:
   first and second common control gate lines; and
   a row decoder configured to drive the word lines of the memory and the first and second common control gate lines, wherein:
      the control gate terminals of all the floating gate transistors of the memory cells of the first group of a row are coupled to the first common control gate line, and
      the control gate terminals of all the floating gate transistors of the memory cells of the second group of a row are coupled to the second common control gate line.

25. A handheld device according to claim 21, wherein the EEPROM includes erasing means for simultaneously erasing the memory cells of the first group of a selected row of the rows without erasing the memory cells of the second group of the selected row, or simultaneously erasing the memory cells of the second group of the selected row without erasing the memory cells of the first group of the selected row.

26. A handheld device according to claim 21, wherein the EEPROM includes sense amplifiers configured to read the memory cells, the sense amplifiers being respectively coupled to sets of the memory cells, wherein for each set, the memory cells of the set are configured to store bits of a same rank of the words of one of the rows, no matter to which group the memory cells belong, and are coupled to the respective sense amplifier through immediately adjacent bit lines.

* * * * *